United States Patent
Hu et al.

(10) Patent No.: US 10,747,017 B2
(45) Date of Patent: Aug. 18, 2020

(54) AUTOSTEREOSCOPIC PIXEL EMITTING UNIT AND 2D/3D AUTO-CONVERSION DISPLAY DEVICE

(71) Applicant: Chi-Chung Hu, New Taipei (TW)

(72) Inventors: Chi-Chung Hu, New Taipei (TW); Tzeng-Guang Tsai, Taoyuan (TW)

(73) Assignee: Chi-Chung Hu, New Taipei (TW)

( * ) Notice: Subject to any disclaimer, the term of this patent is extended or adjusted under 35 U.S.C. 154(b) by 128 days.

(21) Appl. No.: 15/762,028

(22) PCT Filed: Jan. 19, 2016

(86) PCT No.: PCT/CN2016/071346
§ 371 (c)(1),
(2) Date: Mar. 21, 2018

(87) PCT Pub. No.: WO2017/117825
PCT Pub. Date: Jul. 13, 2017

(65) Prior Publication Data
US 2018/0284467 A1    Oct. 4, 2018

(30) Foreign Application Priority Data
Jan. 4, 2016  (CN) .................... 2016 2 0006697 U

(51) Int. Cl.
*G02B 30/27*        (2020.01)
*G09G 3/20*         (2006.01)
(Continued)

(52) U.S. Cl.
CPC ............. *G02B 30/27* (2020.01); *G02B 30/24* (2020.01); *G09G 3/20* (2013.01); *H01L 27/3232* (2013.01);
(Continued)

(58) Field of Classification Search
CPC .. G02B 27/2214; G02B 27/2264; G09G 3/20; H01L 25/048; H01L 25/0753;
(Continued)

(56) References Cited

U.S. PATENT DOCUMENTS

2002/0113753 A1\*  8/2002  Sullivan ............... G02B 27/225
                                                     345/6
2012/0008056 A1\*  1/2012  Gong .................. G02B 27/2214
                                                     349/15
(Continued)

FOREIGN PATENT DOCUMENTS

CN   103995361 A  \*  8/2014  ......... G02B 27/2214
CN   103995361 A     8/2014

*Primary Examiner* — Francis Geroleo
(74) *Attorney, Agent, or Firm* — Amster, Rothstein & Ebenstein LLP

(57) ABSTRACT

An autostereoscopic pixel emitting unit comprises a plurality of pixel units, a substrate, and an optical package structure. The specific chip is designed to emit light in a time-sequenced manner to the direction of right and left eyes of observer which is then combined in one's brain to provide the 3D perception. The autostereoscopic pixel emitting unit differentiates itself with prior arts by minimizing the size of the autostereoscopic display device to a component level. By using the autostereoscopic pixel emitting unit, a large-sized glasses-free 3D display maybe be assembled into a variety of configuration with the functions of 2D/3D auto-conversion and showing 2D and 3D contents in various area of the screen simultaneously. The present invention has multiple advantages such as free from panel optical lens, any large-sized screen area, flat or curved surface installation, cost-effective, and easy maintenance.

9 Claims, 8 Drawing Sheets

(51) Int. Cl.
| | |
|---|---|
| H01L 27/32 | (2006.01) |
| H01L 51/52 | (2006.01) |
| H04N 13/341 | (2018.01) |
| G02B 30/24 | (2020.01) |
| H04N 13/305 | (2018.01) |
| H04N 13/32 | (2018.01) |
| H04N 13/351 | (2018.01) |
| H04N 13/356 | (2018.01) |
| H04N 13/398 | (2018.01) |
| H04N 13/31 | (2018.01) |
| H04L 25/04 | (2006.01) |
| H01L 25/075 | (2006.01) |
| H01L 25/04 | (2014.01) |

(52) U.S. Cl.
CPC ....... *H01L 51/5225* (2013.01); *H04N 13/305* (2018.05); *H04N 13/32* (2018.05); *H04N 13/341* (2018.05); *H04N 13/351* (2018.05); *H04N 13/356* (2018.05); *H04N 13/398* (2018.05); *H01L 25/048* (2013.01); *H01L 25/0753* (2013.01); *H04N 13/31* (2018.05)

(58) Field of Classification Search
CPC ............ H01L 27/3232; H01L 51/5225; H04N 13/305; H04N 13/31; H04N 13/32; H04N 13/341; H04N 13/351; H04N 13/356; H04N 13/398
See application file for complete search history.

(56) References Cited

U.S. PATENT DOCUMENTS

| | | | |
|---|---|---|---|
| 2015/0271482 A1* | 9/2015 | Chen | G02F 1/134309 349/65 |
| 2016/0154291 A1* | 6/2016 | Gibson | G02F 1/139 349/33 |
| 2017/0155891 A1* | 6/2017 | Hu | G02B 27/22 |

* cited by examiner

AUTOSTEREOSCOPIC PIXEL EMITTING UNIT AND 2D/3D AUTO-CONVERSION DISPLAY DEVICE

CROSS-REFERENCES TO RELATED PATENT APPLICATION

This application claims and the benefit of priority to Chinese Patent Application No. 201610003914.2, filed on Jan. 4, 2016, and to Chinese Patent Application No. 201620006697.8, filed on Jan. 4, 2016 entitled "autostereoscopic pixel emitting unit and 2D/3D auto-conversion display device", and the disclosure of which is incorporated herein in its entirety by reference.

FIELD OF THE INVENTION

This invention relates to the glasses free 3D display field, and in particular relates to an autostereoscopic pixel emitting unit and display device with the function of 2D/3D auto-conversion thereof.

BACKGROUND OF THE INVENTION

Since the average pupil distance of one's left and right eye is about 6.0 cm-7.0 cm, resulting in two images received by the retinas are slightly different because of the difference in viewing angles. The fusion of two perspective images to produce depth perception is one of the essential functions of human brain. The stereoscopic effect is formed when one watches an object.

In the field of autostereoscopic display technology, the existing 3D display technologies are divided into two categories; glasses type and autostereoscopic type. For autostereoscopic display technology, the lenticular lens and the parallax barrier are adopted by most of the display products.

In general, the grating lens is needed to present stereoscopic images by matching with the LCD panel. The manufacturing and assembly processes of the LCD panel and grating lens are sophisticated and costly. The quality of the 3D effect perceived by observers is determined by the accuracy of pixels alignment with the lens. This results in, especially for large-sized display panels, the high rejection rate due to misalignment during the assembly process. In addition, the size of the panel and precision of the grating lens are restricted by the manufacturing facilities. Therefore, the grating lens technology is unsuitable for the large-sized display products.

Although, the medium-sized LCD panel with grating lens in front is an effective measure for the realization of glasses free 3D. But, in the meantime, the 2D images or texts will be deteriorated by the grating lens. On the other hand, the existing techniques for switching 2D/3D display modes are mostly implemented by using optoelectronic components or moving optics. But it is still not widely implemented in today's products. All the similar disadvantages will be occurred when the large-sized LED display adopt the grating lens in front of the screen to achieve glasses free 3D and 2D/3D auto-conversion.

In Chinese Patent No. CN103995361 B, an autostereoscopic pixel unit is invented and assembled to from a glasses free 3D display device. Each optical guiding area converge the light from light mixing area and deflects into directions toward the each eye of the viewers. The binocular parallax image is then formed by the left and right eyes of the viewers, therefore a stereoscopic image is then perceived by one's brain. Since an autostereoscopic pixel units is minimized to a component level, through assembling a specific number of pixel units into display module, and several display modules can be spliced to vast display area to present 3D images without installing grating lens in front of the screen. In addition, the full color LEDs and autostereoscopic pixel emitting units are arranged alternately by row and column on the circuit board to form a display module, and assembled into a large-sized screen. The system switch the 2D and 3D image modes by alternatively lighting up or off via the full color LEDs and autostereoscopic pixel emitting units. When the full color LEDs is on, the autostereoscopic pixel emitting unit will be off. At that moment, the screen presents 2D images. Conversely, when autostereoscopic pixel emitting unit is on, the screen presents 3D images. But, it is difficult to control and balance the difference in brightness, contrast and color of the adjacent full color LEDs and autostereoscopic pixel emitting units. On the other hand, the pitch of autostereoscopic pixel emitting unit for presenting 3D images and the pitch of the full color LEDs to present 2D images are increased correspondingly, this result in reducing the resolution of the whole display.

These shortcomings mentioned above are still the technical barriers of glasses free 3D large-sized screen which needs to be overcome. In this regard, the autostereoscopic pixel emitting unit which is able to transmit the 2D images and the 3D parallax images simultaneously, and the 2D/3D auto-conversion may be realized for the whole screen or for several portions of the display area, is a novel solution desired. These functions are essentially important when mixing various 2D or 3D contents in series for showing on a large screen without optical solution arranged in front.

SUMMARY OF THE INVENTION

The present invention is to provide an autostereoscopic pixel emitting unit and a 2D/3D auto-conversion display device which overcomes the deficiencies mentioned above.

The packaged autostereoscopic pixel emitting unit according to some embodiments of the invention includes a substrate, the first electrode layer on the substrate, the first doped layer on the first electrode layer, the second doped layer formed on first doped layer, and a plurality of second electrode layers are respectively arranged on the second doped layer with no connection to each other. Furthermore, a pixel unit contains at least one red, green, and blue light-emitting unit which are disposed on the second doped layer. The optical package surrounds the light-emitting units. The optical package, which covers the light-emitting units contain at least one light mixing area and one optical guiding area. The at least one light mixing area is installed on the light-emitting units, and the at least one optical guiding area is arranged on at least one light mixing area. The electric control circuit is included in the substrate. The electric control circuit connects and transmits 2D and/or 3D image signals to the light-emitting units. Wherein, the light-emitting units projects the light directly through the light mixing area and the optical guiding area after receiving a 2D image signal, the viewers' eyes receive the light through the autostereoscopic pixel emitting unit as a 2D image. On the other hand, as a 3D image signal transmitted to the light-emitting units, an electric field is formed via the connection between one of the second electrode layers and the first electrode layer correspondingly, so that the light deflected by the electric field and emitted toward one of the viewer's eyes. Wherein, by using time-sequenced control in a rotation manner, the other electric field is formed and the light deflected again which emitted toward the other eye of the viewer. A binocular parallax image is then formed by the left and right eyes of the viewer. Therefore a stereoscopic image is then perceived by one's brain.

A plurality of second electrode layers is respectively arranged on the second doped layer with no connection to each other. A light project is based on the connection between the second electrode layer and the first electrode layer. The electric control circuit is configured to form an electric field alternatively by a time-sequenced connection between each pair of the second electrode layer and the first electrode layer. Accordingly, the consecutive projection of light with deflected light toward the left and right eyes of the viewer.

The optical guiding area may further contain at least one light exiting surface which is away from the pixel unit. The light exiting surface, as a supplementary to the deflection angle of light, includes a horizontal plane, a sloped plane, a curved surface or a double-layered plane or combinations. By adopting the micro-lens design and manufacturing technology, either the lenticular lens or the parallax barrier may be applied to the optical guiding area in order to lead the light emitted from the pixel unit with deflected angles toward the left and right eyes of the viewer.

Preferably, the optical package materials contain polycarbonate, polymethyl methacrylate, resin, silicon, glass, epoxy resin, or any combination of said materials. The structure of package is either hollow, solid, or finished with the technology of chip scale packaging. The cross section of optical package is either in the shape of rectangle, circle, triangle, or polygon.

The packaged autostereoscopic pixel emitting unit according to further embodiments of the invention includes a substrate, the first electrode layer on the substrate, the first doped layer on the first electrode layer, the second doped layer formed on first doped layer, and a plurality of second electrode layers are respectively arranged on the second doped layer with no connection to each other. Furthermore, a plurality of pixel units on the second doped layer, and each pixel unit at least contains a red light-emitting unit, a green light-emitting unit, and a blue light-emitting unit. The optical package surrounds the pixel units. The optical package, which covers the light-emitting units contain at least one light mixing area and one optical guiding area. The at least one light mixing area is installed on the light-emitting units, and the at least one optical guiding area is arranged on at least one light mixing area. The electric control circuit is included in the substrate. The electric control circuit connects and transmits 2D and/or 3D image signals to the pixel units. Wherein, the pixel units projects the light directly through the light mixing area and the optical guiding area after receiving a 2D image signal, the viewer's eyes receive the light through the autostereoscopic pixel emitting unit as a 2D image. On the other hand, as a 3D image signal transmitted to the pixel units, an electric field is formed via the connection between one of the second electrode layers and the first electrode layer correspondingly, so that the light deflected by the electric field and emitted toward one of the viewer's eyes. Wherein, by using time-sequenced control in a rotation manner, the other electric field is formed and the light deflected again which emitted toward the other eye of the viewer. A binocular parallax image is then formed by the left and right eyes of the viewer. Therefore a stereoscopic image is then perceived by one's brain.

A plurality of second electrode layers is respectively arranged on the second doped layer with no connection to each other. A light project is based on the connection between the second electrode layer and the first electrode layer. The electric control circuit is configured to form an electric field alternatively by a time-sequenced connection between each pair of the second electrode layer and the first electrode layer. Accordingly, the consecutive projection of light with deflected light toward the left and right eyes of the viewer.

The optical guiding area may further contain at least one light exiting surface which is away from the pixel units. The light exiting surface, as a supplementary to the deflection angle of light includes a horizontal plane, a sloped plane, a curved surface or a double-layered plane and combinations. By adopting the micro-lens design and manufacturing technology, either the lenticular lens or the parallax barrier may be applied to the optical guiding area in order to lead the light emitted from the pixel unit with deflected angles toward the left and right eyes of the viewer.

Preferably, the optical package materials contain Polycarbonate (PC), Polymethyl methacrylate (PMMA), Resin, Silicon, glass, Epoxy, or any combination of said materials. The structure of package is either hollow or solid structure, or finished with the technology of chip scale packaging. The cross section of optical package is either in the shape of rectangle, circle, triangle, or polygon.

A plurality of pixel units may further aligned with each other through the latitude and longitude line arrangement, slant line arrangement, two-line crossing arrangement, arranged in a staggered manner, arranged in a triangular or arranged in a polygonal form.

One embodiment of the disclosure provides an autostereoscopic display device with the 2D/3D auto-conversion functions comprising display module, content playback device and a content storage device. A display module comprising of a plurality of autostereoscopic pixel emitting units are arranged in each row and column on a circuit board and assembled into the hardware housing. A display screen comprising of a plurality of display modules arranged vertically and horizontally, the screen is either a flat or curved configuration, all of the display modules receive 2D image signals and the corresponding 2D content is present on the whole screen, while all of the display modules receive 3D image signals and the corresponding parallax images are delivered and stereoscopic images are present on the whole screen. On the other hand, while an area of the display screen, i.e. several display modules, receives 2D image signals and the corresponding 2D content is present, while the remaining area of the display screen receives 3D image signals and the corresponding parallax images are delivered and glasses free 3 D images are present.

Wherein, the autostereoscopic display device is connected with a content playback device. The content playback device receives the 2D and/or 3D image data received from the content storage device. The playback device decodes the 2D and/or 3D image data to generate corresponding image signals to the autostereoscopic display device.

Due to the objective mentioned above, this new invention offers a 2D/3D auto-conversion display device comprises a plurality of autostereoscopic pixel emitting units and the control system. The autostereoscopic pixel emitting units are connected to the controlling system through electric circuit board. The electric control circuit of the autostereoscopic display device with the 2D/3D auto-conversion functions, wherein, is configured to form an electric field alternatively by a time-sequenced connection between each pair of the second electrode layer and the first electrode layer in the autostereoscopic pixel emitting units, accordingly, the consecutive projection of light with deflected angles toward the left and right eyes of the viewer. The controlling system controls a plurality of the autostereoscopic pixel emitting units individually or in groups of module to display 2D and/or 3D content on the screen correspondingly. Wherein, achieving the function of displaying 2D and/or 3D images at the same time in different areas of the screen, or showing 2D or 3D images on full screen according to the content of the 2D or 3D programs provided.

BRIEF DESCRIPTION OF THE DRAWINGS

Many aspects of the autostereoscopic pixel emitting unit and a 2D/3D auto-conversion display device can be better understood with reference to the following drawings. The components in the drawings are not necessarily drawn to scale, the emphasis instead being placed on clearly illustrating the principles of the present autostereoscopic pixel emitting unit and a 2D/3D auto-conversion display device. Moreover, in the drawings, like reference numerals designate corresponding parts

DESCRIPTIONS FOR THE REFERENCE NUMBERS OF THE FIGS

Figure 1:
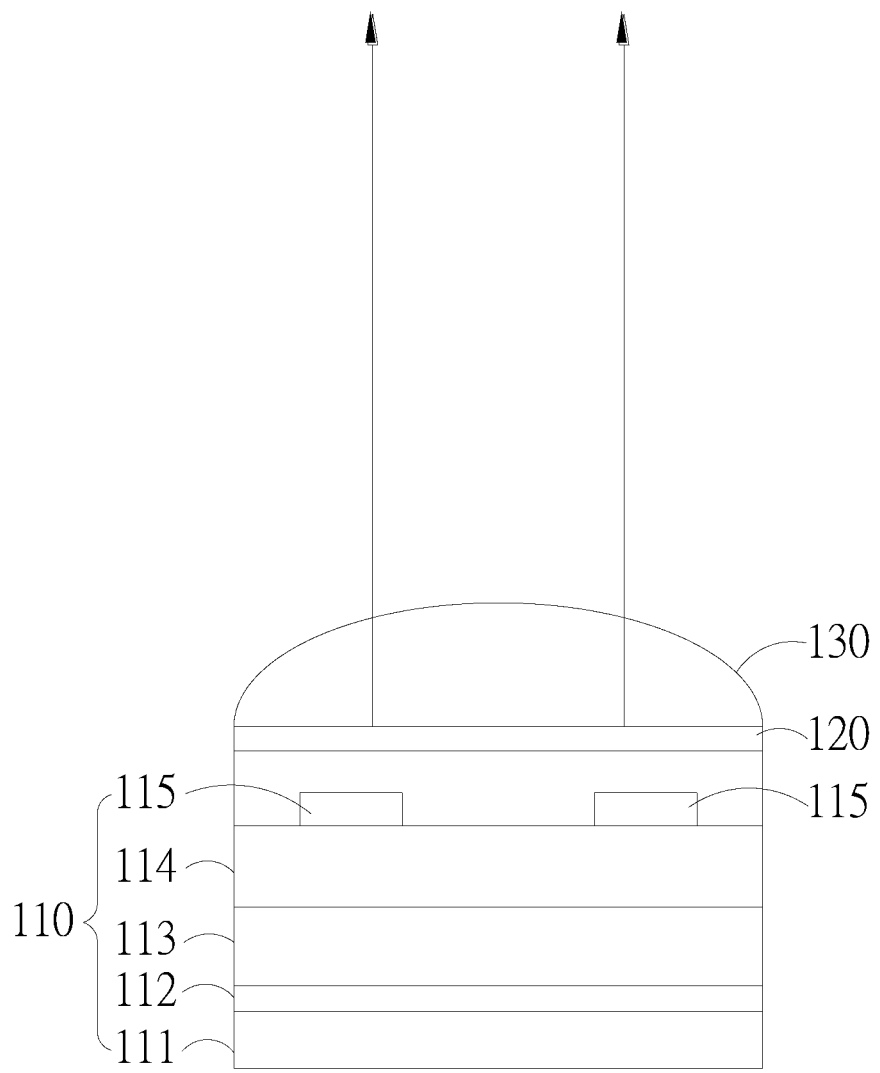
FIG. 1 is a cross-sectional view of an autostereoscopic pixel emitting unit along line A-A illustrated in FIG. 3 with straight light according to the first embodiment of the present invention.

1: an autostereoscopic pixel emitting unit
110: a pixel unit
110a: red light-emitting unit
110b: green light-emitting unit
110c: blue light-emitting unit
111: substrate
112: the first electrode layer
113: the first doped layer
114: the second doped layer
115,115a, 115b: the second electrode layer
120: light mixing area
130: optical guiding area
2: display screen
20: display device with 2D/3D auto-conversion function.
21: display module
3: content playback device
4: content storage device

DESCRIPTION OF THE PREFERRED EMBODIMENTS

The present invention will be described fully with reference to the accompanying drawings, in which embodiments of the invention are shown. The description is made for the purpose of illustrating the general principles of the present invention and should not be taken in a limiting sense.

Figure 2:
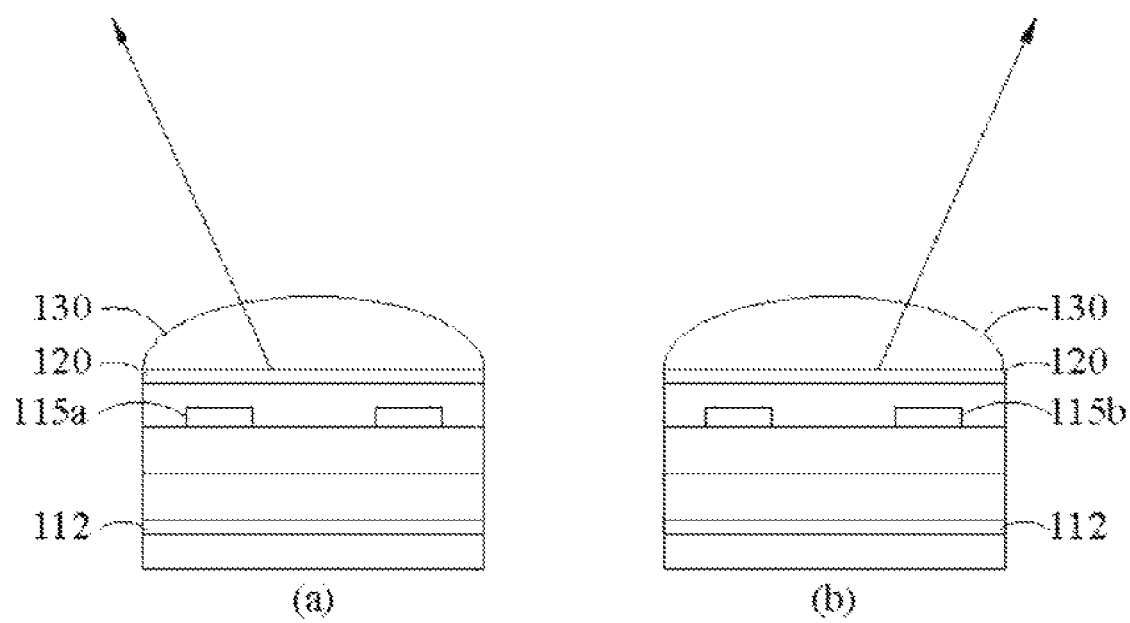
FIG. 2 is a side view illustrating an autostereoscopic pixel emitting unit with deflected light according to the first embodiment of the present invention.
Figure 3:
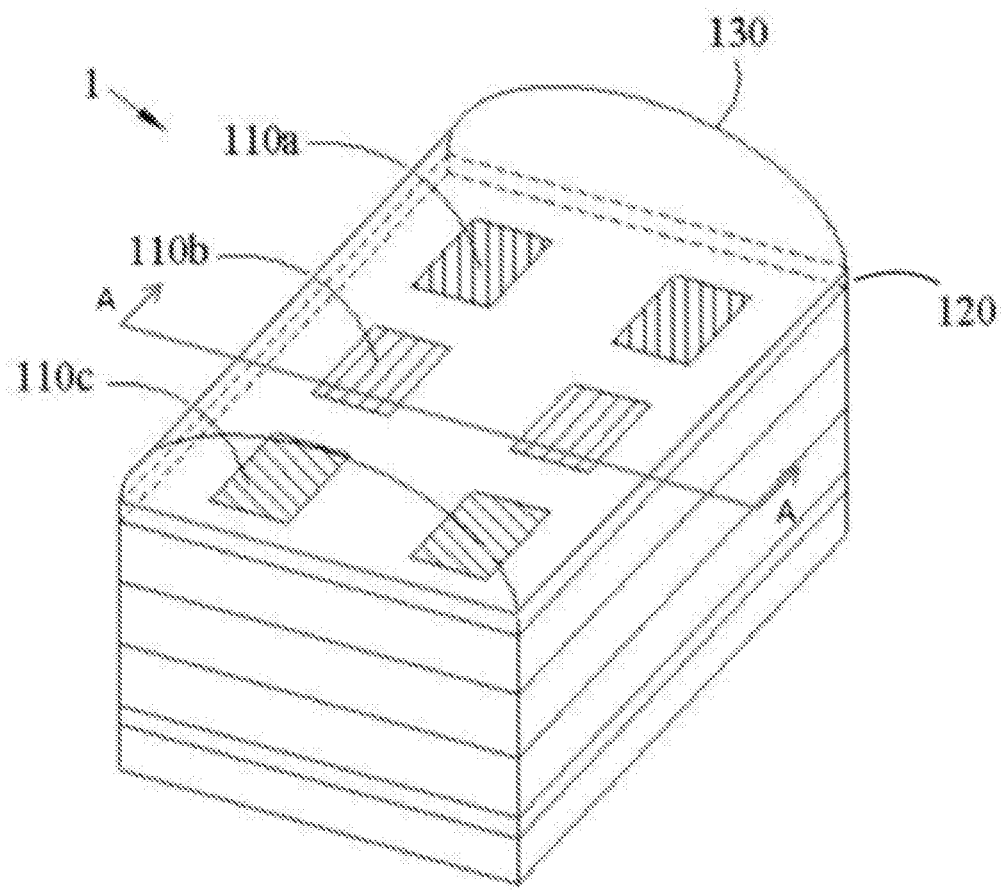
FIG. 3 is a schematic drawing of an autostereoscopic pixel emitting unit according to the first embodiment of the present invention.

Referring to FIG. 1 is a side view illustrating an autostereoscopic pixel emitting unit with straight light according to the first embodiment of the present invention. FIG. 2 is a side view illustrating an autostereoscopic pixel emitting unit with deflected light. FIG. 3 is a schematic drawing of an autostereoscopic pixel emitting unit. As shown in the FIGs, the autostereoscopic pixel emitting unit comprised of a pixel unit 110, light mixing area 120, optical guiding area 130 and a control circuit (not illustrated).

According to the exemplary embodiment, the autostereoscopic pixel emitting unit 1 includes pixel unit 110 includes a substrate 111, the first electrode layer 112, the first doped layer 113, the second doped layer 114, and a plurality of second electrode layers 115. Furthermore, the pixel unit 110 contains at least a red light-emitting unit 110a, green light-emitting unit 110b, and blue light-emitting unit 110c which are disposed on the second doped layer 114.

The first electrode layer 112 on the substrate 111, the first doped layer 113 on the first electrode layer 112, the second doped layer 114 formed on first doped layer 113, and a plurality of second electrode layers 115 are respectively arranged with no connection to each other on the second doped layer 114.

As shown in FIG. 1, the total number of the second electrode layer 115 is two. In some embodiments, the first electrode layer 112 is a N-type electrode layer, the second electrode layer 115 is a P-type electrode layer. On the other hand, if the first electrode layer 112 is a P-type electrode layer, then the second electrode layer 115 will then be N-type electrode layer.

The optical package surrounds the pixel unit 110. The optical package may contain at least one optical guiding area 130 disposing on at least one light mixing area 120. The electric control circuit, included in the substrate 111, connecting and transmitting the 2D and/or 3D image signals to the pixel unit 110.

The optical guiding area 130 and the light mixing area 120 can be composed of a combination of different materials or same material manufactured by integral molding. The optical guiding area 130 may further contains at least one light exiting surface which is away from the pixel unit 110. The light exiting surface, as a supplementary to the deflection angle of light, may be formed as a horizontal plane, a sloped plane, a curved surface, a double-layered plane, or combinations. By adopting the micro-lens design and manufacturing technology, either the lenticular lens, parallax barrier, or other lens design may be applied to the optical guiding area 130 in order to lead the light emitted from the pixel unit 110 with deflected angles toward the left and right eyes of the viewer. Preferably, the optical package is either hollow or solid structure, or it may be finished with the technology of chip scale packaging. The cross section of optical package is either in the shape of a rectangle, circle, triangle, or polygon.

When the electric control circuit sends the 2D image signal to the pixel unit 110, wherein, the pixel unit 110 projects the light directly through the light mixing area 120 and the optical guiding area 130. After the receiving light projected, the left and right eyes of the viewer receive the same light through the autostereoscopic pixel emitting unit as a 2D image.

On the other hand, as a 3D image signal transmitted to the pixel unit 110, an electric field is formed via the connection between one of the second electrode layers, 115a or 115b, and the first electrode layer 112 correspondingly, so that the light deflected by the electric field which emitted toward one of the viewer's eyes. Wherein, by using time-sequenced control in a rotation manner, the other electric field is formed afterward and the light deflected again which emitted toward the other eye of the viewer's. A binocular parallax image is then formed by the left and right eyes of the viewer. Therefore a stereoscopic image is then perceived by one's brain.

To be more detailed, the electric control circuit is configured to a time-sequenced control manner. At time T1, a 3D image signal transmitted to the pixel unit 110, one of the second electrode layers 115a and the first electrode layer 112 form an electric field. The pixel unit 110 then projects a light deflected according to the line connecting between the first electrode layer 112 and the second electrode layer 115a as shown in FIG. 2a. While at time T2, the other one of second electrode layers 115b and pair with the first electrode layer 112 to form an electric field, the pixel unit 110 then projects a light deflected according to the line connecting between the first electrode layer 112 and the second electrode layer 115b as shown in FIG. 2b.

Therefore, the light project from the pixel unit 110 is based on the connection between the pair of second electrode layer 115a or 115b with the first electrode layer 112. Accordingly, the consecutive projection of light with deflected light toward the left and right eyes of the viewer. A binocular parallax image is then formed by the left and right eyes of the viewer. Wherein, a stereoscopic image is then perceived by one's brain.

The further operation includes the reinforcement by light mixing area 120 and the optical guiding area 130 to increase the deflection angle of the light from the pixel unit 110. The autostereoscopic pixel emitting unit may project the 3D image to the next viewing point in a consecutive manner through coordinating with the time-sequenced control. Therefore, the multi-viewing function may achieve through the rapid and continuing change of the projection angle from the autostereoscopic pixel emitting unit.

On the other hand, when the pixel unit 110 is receiving signals of 2D images, all of the second electrode layers 115 will form the electric field with the first electrode layer 112 at the same time. Thus the projection of light from the pixel unit 110 will not be deflected. As shown in FIG. 1, the autostereoscopic pixel emitting unit 1 with straight light toward both eyes of the viewer as a 2D images.

It should be noted that the pixel unit 110 of the invention is fabricated through the semiconductor manufacturing process. The first electrode layer 112 and a plurality of the second electrode layers 115 are formed through the wire bonding of the semiconductor process. The autostereoscopic pixel emitting unit 1 may be comprised of LED or OLED (organic light emitting diode). The materials of the optical package may comprise of: a Polycarbonate (PC), Polymethyl methacrylate (PMMA), Resin, Silicon, glass, Epoxy. Through a thermosetting molding or ultraviolet curing, the optical package can be formed as a hollow or solid structure. The chip scale packing technology may further be implemented for the autostereoscopic pixel emitting unit 1.

Figure 4:
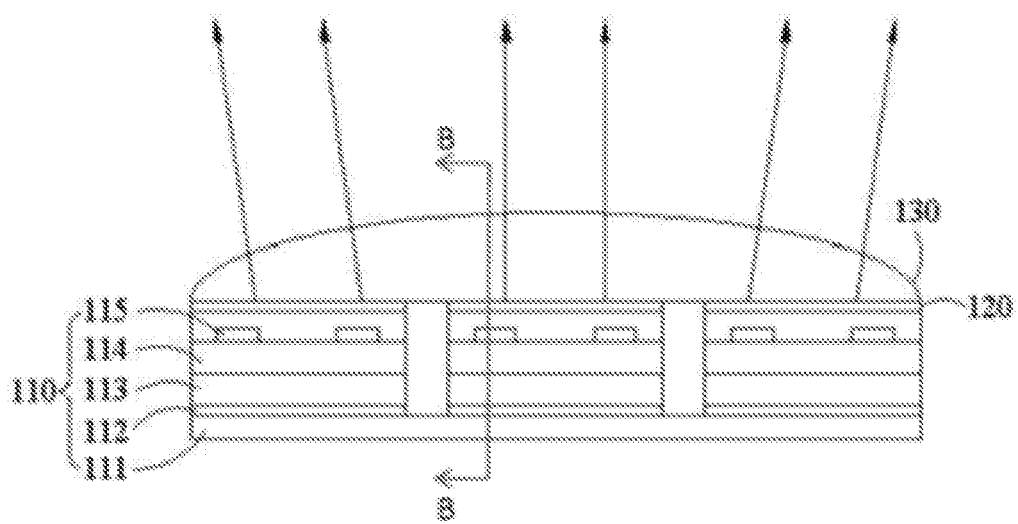
FIG. 4 is a cross-sectional view of an autostereoscopic pixel emitting unit along line A-A illustrated in FIG. 7 according to the second embodiment of the present invention.
Figure 5:
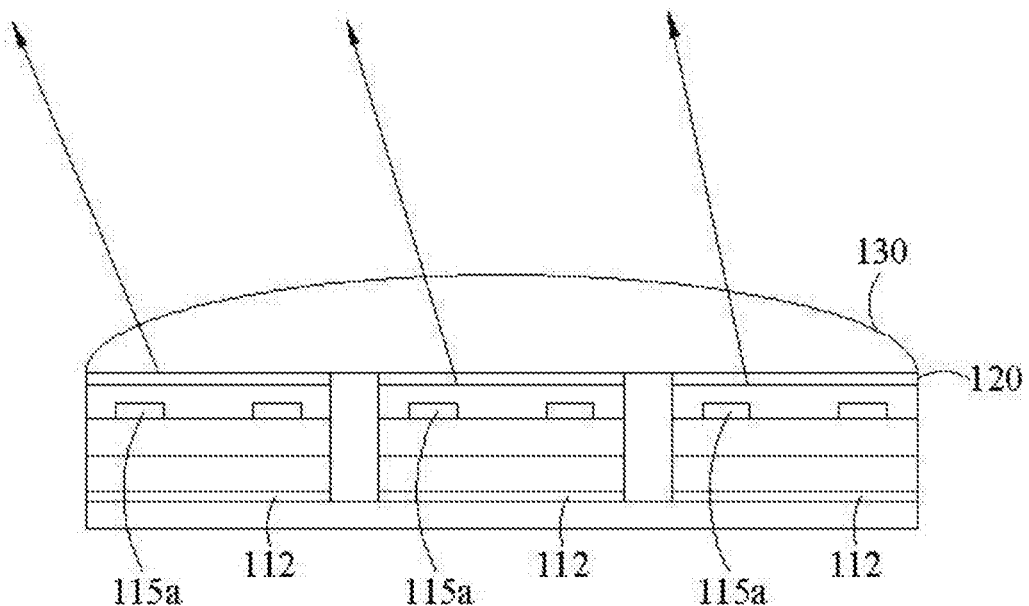
FIG. 5 is the first side view illustrating an autostereoscopic pixel emitting unit with deflected light according to the second embodiment of the present invention.
Figure 6:
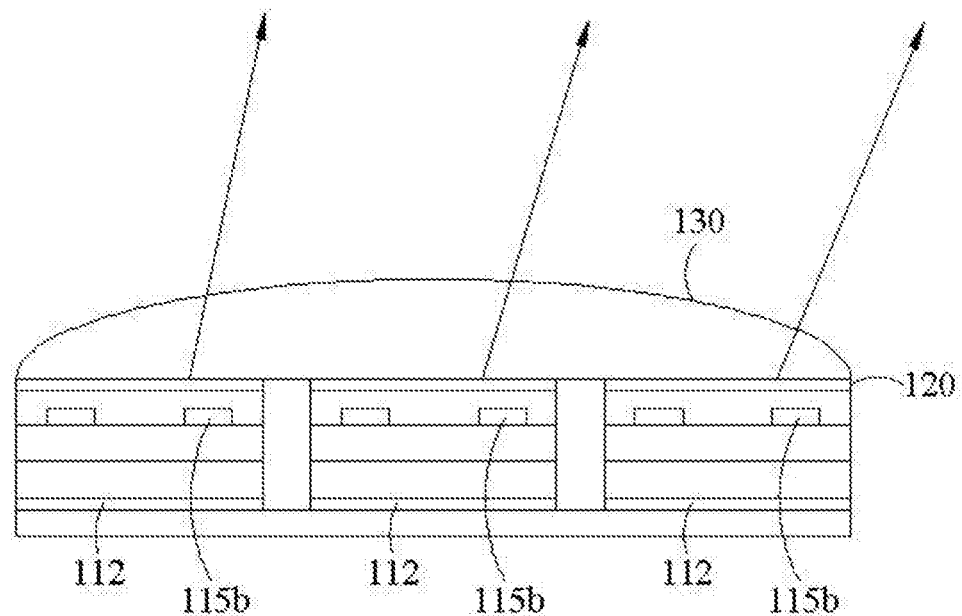
FIG. 6 is the second side view illustrating an autostereoscopic pixel emitting unit with deflected light according to the second embodiment of the present invention.
Figure 7:
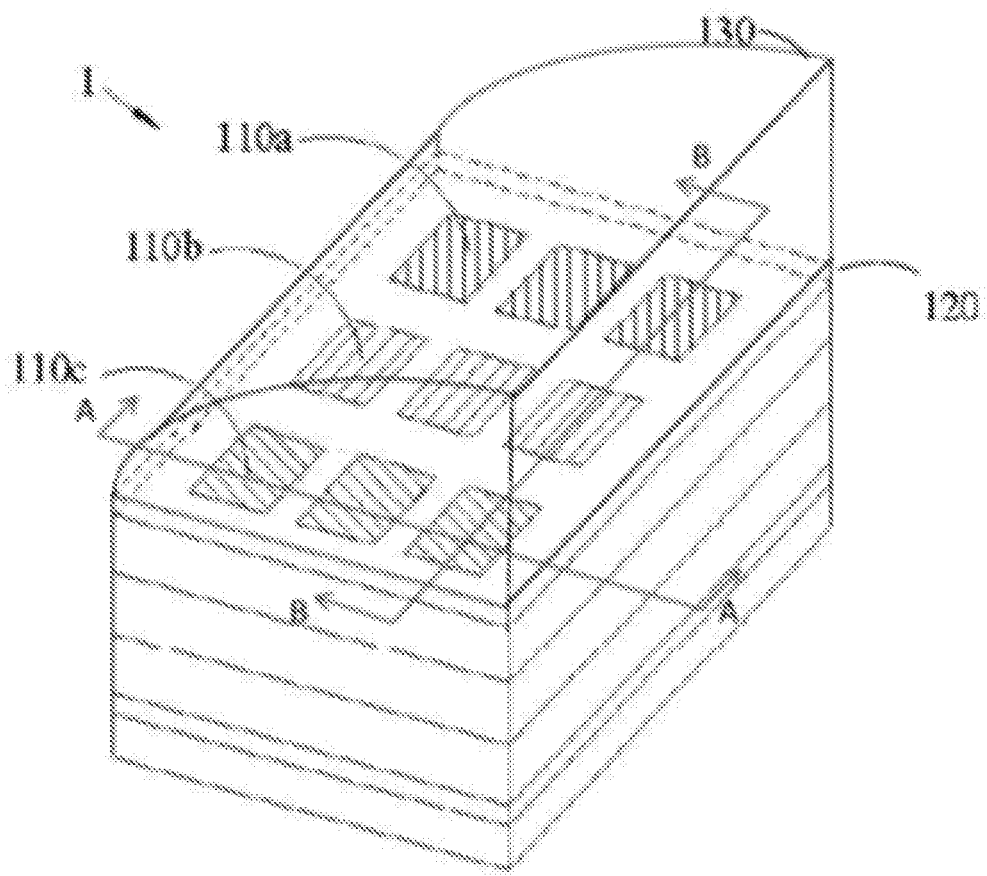
FIG. 7 is a schematic drawing of an autostereoscopic pixel emitting unit which is a half portion cut from a symmetric plane according to the second embodiment of the present invention.
Figure 8:
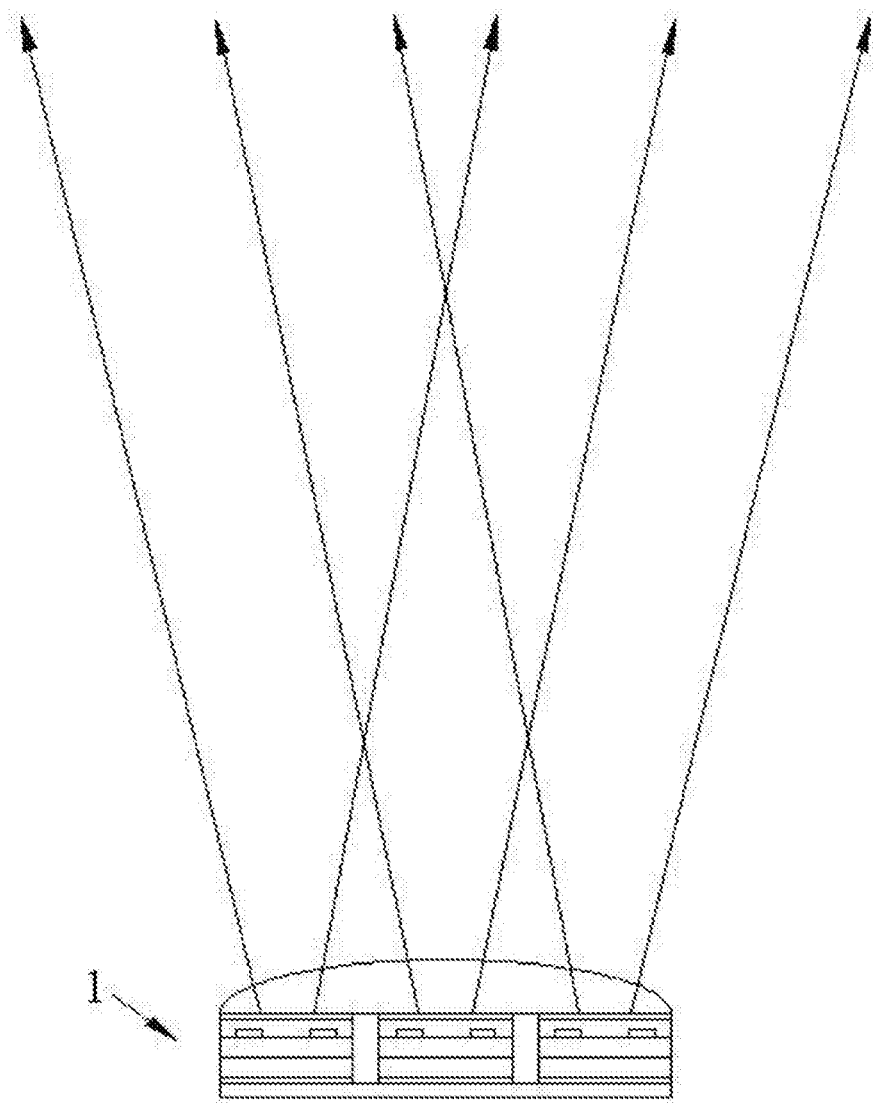
FIG. 8 is a side view illustrating an autostereoscopic pixel emitting unit with deflected light according to the second embodiment of the present invention.

The second embodiment of the autostereoscopic pixel emitting unit is illustrated in FIG. 4 to FIG. 8. FIG. 4 is a side view of an autostereoscopic pixel emitting unit with a plurality of pixel units 110, light mixing area 120, and optical guiding area 130. FIG. 5 is the first side view illustrating an autostereoscopic pixel emitting unit with deflected light toward the left eye of a viewer. FIG. 6 is the second side view illustrating an autostereoscopic pixel emitting unit with deflected light toward the right eye of a viewer. FIG. 7 is a schematic drawing of an autostereoscopic pixel emitting unit with a plurality of pixel units 110. FIG. 8 is a side view illustrating an autostereoscopic pixel emitting unit with two deflected lights toward the left and right eye of a viewer which formed a binocular parallax image and then perceived as a stereoscopic image by one's brain. The difference of the autostereoscopic pixel emitting unit between this embodiment and the first embodiment is that the autostereoscopic pixel emitting unit in this embodiment includes a plurality of pixel units 110.

According to the second embodiment, the autostereoscopic pixel emitting unit includes a plurality of pixel units 110, which further comprises red light emitting unit 110a, green light emitting unit 110b, blue light emitting unit 110c. Wherein, all include a substrate 111, a first electrode layer 112, first doped layer 112, second doped layer 114, and a plurality of second electrode layers 115. Wherein, a first electrode layer 112 disposed on the substrate 111. A first doped layer 113 disposed on the first electrode layer 112. A second doped layer 114 formed on first doped layer 113. A plurality of second electrode layers 115 respectively disposed on opposite and not connected to the second doped layer 114.

Again, the total number of the second electrode layer 115 is two. In the second embodiments, the first electrode layer 112 is a N-type electrode layer, the second electrode layer 115 is a P-type electrode layer. On the other hand, if the first electrode layer 112 is a P-type electrode layer, then the second electrode layer 115 will then be N-type electrode layer.

The optical package surrounds a plurality of pixel units 110. The optical package may contain at least one optical guiding area 130 disposing on at least one light mixing area 120. The electric control circuit, included in the substrate 111, connecting and transmitting the 2D and/or 3D image signals to a plurality of pixel units 110.

When the electric control circuit sends the 2D image signal to a plurality of pixel units 110, wherein, the pixel units 110 project the light directly through the light mixing area 120 and the optical guiding area 130. After the receiving light projected, the left and right eyes of the viewer receive the same light through the autostereoscopic pixel emitting unit as a 2D image.

On the other hand, as a 3D image signal transmitted to a plurality of pixel units 110, an electric field is formed via the connection between one of the second electrode layers, 115a or 115b, and the first electrode layer 112 correspondingly, so that the light deflected by the electric field which emitted toward one of the viewer's eye. Wherein, by using time-sequenced control in a rotation manner, the other electric field is formed afterward and the light deflected again which emitted toward the other eye of the viewer. A binocular parallax image is then formed by the left and right eyes of the viewer. Therefore a stereoscopic image is then perceived by one's brain.

To be more detailed, the electric control circuit is configured to a time-sequenced control manner. At time T1, a 3D image signal transmitted to the pixel units 110, one of the second electrode layers 115a and the first electrode layer 112 form an electric field. The pixel units 110 then projects a light deflected according to the line connecting between the first electrode layer 112 and the second electrode layer 115a as shown in FIG. 5. While at time T2, the other one of second electrode layers 115b and pair with the first electrode layer 112 to form an electric field, the pixel units 110 then projects a light deflected according to the line connecting between the first electrode layer 112 and the second electrode layer 115b as shown in FIG. 6.

In the second embodiments, a plurality of second electrode layers 115 are respectively arranged on the second doped layer 114 with no connection to each other. The electric control circuit is configured to form an electric field alternatively by a time-sequenced connection between each pair of the second electrode layer 115 and the first electrode layer 112. A light project is based on the connection between the second electrode layer and the first electrode layer. Accordingly, the consecutive projection of light with deflected light toward the left and right eyes of the viewer. The binocular parallax image is then formed, wherein, a stereoscopic image is then perceived by one's brain. As shown in FIG. 8, this demonstrates the presentation of the light projected toward left and right eyes by three pixel units 110 after time period of T1 and T2.

Figure 9:
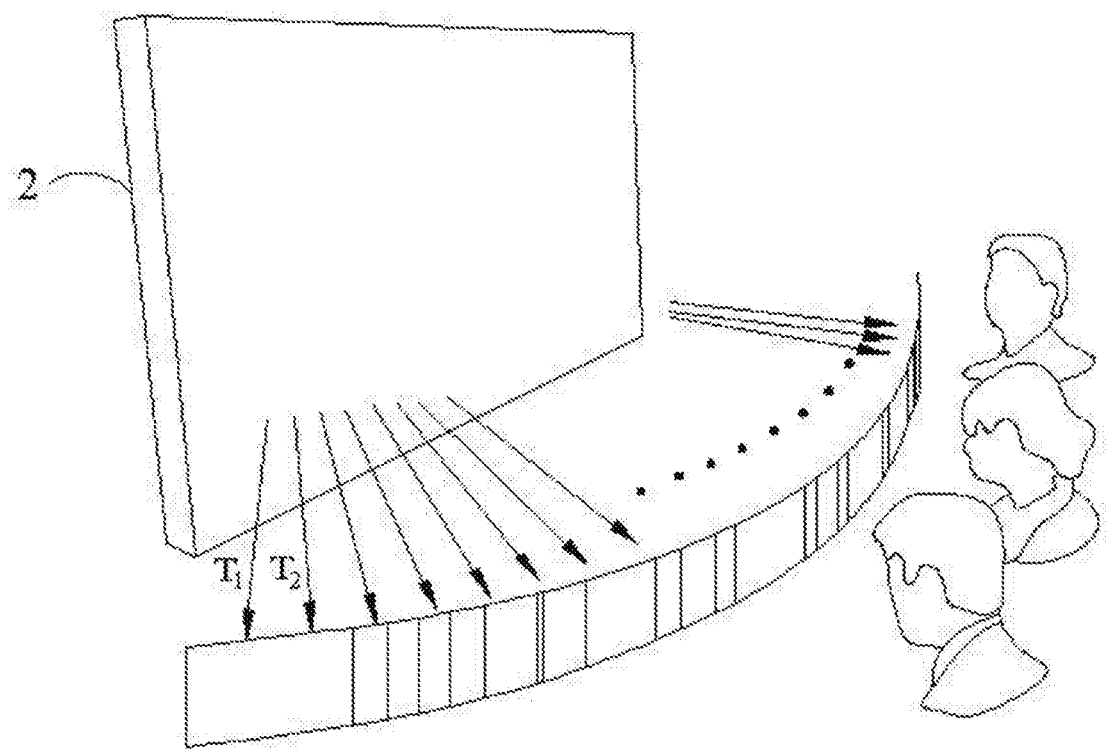
FIG. 9 is a schematic drawing illustrating a 3D multi-view display made from the autostereoscopic pixel emitting unit according to the further embodiment of the present invention.

The further operation includes the reinforcement by light mixing area 120 and the optical guiding area 130 to increase the deflection angle of the light from the pixel units 110. As illustrated in FIG. 9, the autostereoscopic pixel emitting unit may project the 3D image to the next viewing point in a consecutive manner through coordinating with the time-sequenced control. Therefore, the multi-viewing function may achieve through the rapid and continuing change of the projection angle from the autostereoscopic pixel emitting unit.

On the other hand, when the pixel units 110 are receiving signals of 2D images, all of the second electrode layers 115 will form the electric field with the first electrode layer 112 at the same time. Thus the projection of light from the pixel units 110 will not be deflected. As shown in FIG. 4, the autostereoscopic pixel emitting unit 1 with straight light toward both eyes of the viewer as a 2D images.

Figure 10:
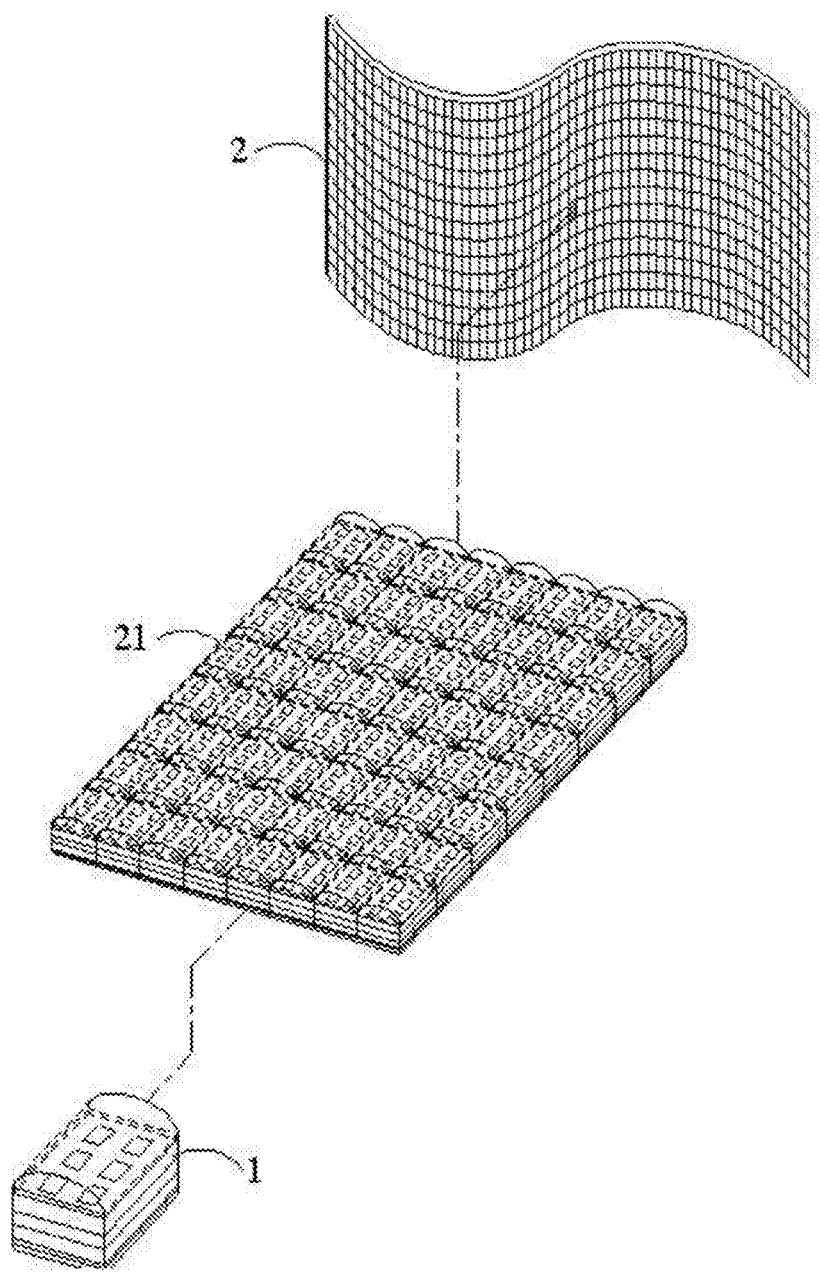
FIG. 10 is a schematic drawing illustrating a free form large-sized 3D multi-view display made from the autostereoscopic pixel emitting unit according to the some embodiments of the present invention.

FIG. 10 is a schematic drawing illustrating a free form large-sized 3D multi-view display made from the autostereoscopic pixel emitting unit according to the present invention. A display module 21 comprising of a plurality of autostereoscopic pixel emitting units are arranged in each row and column on a circuit board and assembled into the hardware housing. A display screen 2 comprising of a plurality of display modules 21 arranged vertically and horizontally, the screen is either a flat or curved configuration. All of the display modules receive 2D image signals and the corresponding 2D content is present on the whole screen, while all of the display modules receive 3D image signals and the corresponding parallax images are delivered and stereoscopic images are present on the whole screen. On the other hand, while an area of the display screen, i.e. several display modules, receives 2D image signals and the corresponding 2D content is present, while the remaining area of the display screen receives 3D image signals and the corresponding parallax images are delivered and glasses free 3 D images are present.

Figure 11:
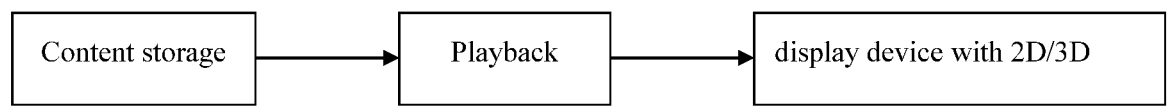
FIG. 11 is the block diagram of a 3D display device with 2D/3D auto-conversion function according to the some embodiments of the present invention;+

As illustrated in FIG. 11 is the block diagram of a 3D display device with 2D/3D auto-conversion function 20 according to the present invention. Wherein, the autostereoscopic display device is connected with a content playback device 3 and a content storage device 4. The 2D or 3D image data received by the playback device 3 was stored in the content storage device 4. The playback device decodes the 2D or 3D image data to generate corresponding image signals to the autostereoscopic display device. Furthermore, the 2D/3D auto-conversion display device 20 comprises a plurality of autostereoscopic pixel emitting units and the control system. The autostereoscopic pixel emitting units are connected to the controlling system through electric circuit board. The controlling system controls a plurality of the autostereoscopic pixel emitting units individually or in groups of module to display 2D and/or 3D content on the screen correspondingly. All of the display modules receive 2D image signals and the corresponding 2D content is present on the whole screen, while all of the display modules receive 3D image signals and the corresponding parallax images are delivered and stereoscopic images are present on the whole screen. On the other hand, while an area of the display screen, i.e. several display modules, receives 2D image signals and the corresponding 2D content is present, while the remaining area of the display screen receives 3D image signals and the corresponding parallax images are delivered and glasses free 3 D images are present. Wherein, the autostereoscopic display device achieves the function of displaying 2D and/or 3D images at the same time in different areas of the screen, or showing 2D or 3D images on full screen according to the content of the 2D or 3D programs provided.

While the present invention has been described as the exemplary and preferred embodiments, the embodiments are able to further modify within the scope and spirit of the present disclosure. The applications are therefore intended to cover any usages, variations and/or adaptations of the embodiments using the general principles of the present invention as claimed. Furthermore, this application is intended to cover such departures from the present disclosure as come within known or customary practice in the art to which the invention pertains and which fall within the limits of the appended claims or equivalents thereof

What is claimed is:

1. An autostereoscopic pixel emitting unit comprising:
    a pixel unit including at least a red light-emitting unit, a green light unit-emitting unit and a blue light-emitting unit, each light-emitting unit including:
    a substrate;
    a first electrode layer on the substrate;
    a first doped layer on the first electrode layer;
    a second doped layer formed on the first doped layer;
    a plurality of second electrode layers are respectively arranged on the second doped layer with no connection to each other;
    an optical package, which covers the light-emitting units and contains at least one light mixing area and at least one optical guiding area, the at least one light mixing area is installed on the light-emitting units, and the at least one optical guiding area is arranged on at least one light mixing area; and
    an electric control circuit, connected and transmitting 2D and/or 3D image signals to the light-emitting units;

wherein, the light-emitting units project the light directly through the light mixing area and the optical guiding area after receiving the 2D image signals, and the viewers' eyes receive the light through the pixel emitting unit as a 2D image, on the other hand, as a 3D image signal transmitted to the light-emitting units, an electric field is formed via the connection between one of the second electrode layers and the first electrode layer correspondingly, so that the light is deflected by the electric field and emitted toward one of the viewer's eyes, wherein, by using time-sequenced control in a rotation manner, another electric field is formed and the light deflected again toward the other eye of the viewer, such that a binocular parallax image is then formed by the left and right eyes of the viewer, therefore a stereoscopic image is perceived by the viewer's brain.

2. The autostereoscopic pixel emitting unit of claim 1, wherein, the electric control circuit is configured to form an electric field alternatively by a time-sequenced connection between each pair of the second electrode layer and the first electrode layer, accordingly, the consecutive projection of light with deflected angles toward the left and right eyes of the viewer.

3. The autostereoscopic pixel emitting unit of claim 1, wherein, the optical guiding area contains at least one light exiting surface which is away from the pixel unit, the light exiting surface as a supplementary to the deflection of light includes a horizontal plane, a sloped plane, a curved surface, a double-layered plane or combinations thereof, by adopting the micro-lens design and manufacturing technology either the lenticular lens or the parallax barrier is applied to the optical guiding area in order to lead the light emitted from the pixel unit with deflected angles toward the left and right eyes of the viewer.

4. The autostereoscopic pixel emitting unit of claim 1, wherein, the optical package materials contain Polycarbonate (PC), Polymethyl methacrylate (PMMA), Resin, Silicon, glass, Epoxy, or any combination of said materials, package structure is either hollow, solid, or finished with the technology of chip scale packaging, thereof the cross section of optical package is either in the shape of rectangle, circle, triangle, or polygon.

5. An autostereoscopic pixel emitting unit comprising:
a plurality of pixel units, each pixel unit including at least a red light-emitting unit, a green-light emitting unit and a blue light-emitting unit, each light-emitting unit including:
a substrate;
a first electrode layer on the substrate;
a first doped layer on the first electrode layer;
a second doped layer formed on the first doped layer;
a plurality of second electrode layers are respectively arranged on the second doped layer with no connection to each other;
an optical package, which covers the light-emitting units and contains at least one light mixing area and at least one optical guiding area, the at least one light mixing area as is installed on the light-emitting units, and the at least one optical guiding area is arranged on at least one light mixing area;
an electric control circuit, connected and transmitting 2D and/or 3D image signals to the light-emitting units;
wherein, the light-emitting units project the light directly through the light mixing area and the optical guiding area after receiving the 2D image signals, and the viewer's eyes receive the light through the pixel emitting unit as a 2D image, on the other hand, as a 3D image signal is transmitted to the light-emitting units, an electric field is formed via the connection between one of the second electrode layers and the first electrode layer correspondingly, so that the light is deflected by the electric field and emitted toward one of the viewer's eyes, wherein, by using time-sequenced control in a rotation manner, another electric field is formed and the light deflected again toward the other eye of the viewer, such that a binocular parallax image is formed by the left and right eyes of the viewer, such that a stereoscopic image is perceived by the viewer's brain.

6. The autostereoscopic pixel emitting unit of claim 5, wherein, the electric control circuit is configured to form an electric field alternatively by a time-sequenced connection between each pair of the second electrode layer and the first electrode layer, accordingly, the consecutive projection of light with deflected angles toward the left and right eyes of the viewer.

7. The autostereoscopic pixel emitting unit of claim 5, wherein, the optical guiding area contains at least one light exiting surface which is away from the pixel units, the light exiting surface as a supplementary to the deflection of light includes one of a horizontal plane, a sloped plane, a curved surface, a double-layered plane combinations thereof, by adopting the micro-lens design and manufacturing technology, the lenticular lens or the parallax barrier is applied to the optical guiding area in order to lead the light emitted from the pixel unit with deflected angles toward the left and right eyes of the viewer.

8. The autostereoscopic pixel emitting unit of claim 5, wherein, the optical package materials contain Polycarbonate (PC), Polymethyl methacrylate (PMMA), Resin, Silicon, glass, Epoxy, or any combination of said materials, package structure is either hollow or solid, or finished with the technology of chip scale packaging, thereof the cross section of optical package is either in the shape of rectangle, circle, triangle, or polygon.

9. The autostereoscopic pixel emitting unit of claim 5, wherein, a plurality of pixel units are aligned with each other through at least one of a latitude and longitude line arrangement, slant line arrangement, two-line crossing arrangement, in a staggered manner, in a triangle and in a polygonal form.

* * * * *